US009825605B2

(12) United States Patent
Yoon

(10) Patent No.: US 9,825,605 B2
(45) Date of Patent: Nov. 21, 2017

(54) HIGH FREQUENCY SIGNAL TERMINATION DEVICE

(71) Applicant: Avago Technologies General IP (Singapore) Pte. Ltd., Singapore (SG)

(72) Inventor: Seunghwan Yoon, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 81 days.

(21) Appl. No.: 15/005,784

(22) Filed: Jan. 25, 2016

(65) Prior Publication Data

US 2017/0194927 A1 Jul. 6, 2017

Related U.S. Application Data

(60) Provisional application No. 62/274,280, filed on Jan. 2, 2016.

(51) Int. Cl.
| | |
|---|---|
| *H01P 1/26* | (2006.01) |
| *H01P 1/24* | (2006.01) |
| *H03H 5/00* | (2006.01) |
| *H03H 3/00* | (2006.01) |
| *H05K 3/30* | (2006.01) |
| *H05K 3/40* | (2006.01) |

(52) U.S. Cl.
CPC ............... *H03H 5/003* (2013.01); *H01P 1/24* (2013.01); *H01P 1/26* (2013.01); *H03H 3/00* (2013.01); *H05K 3/303* (2013.01); *H05K 3/4007* (2013.01)

(58) Field of Classification Search
CPC ............... H01P 1/24; H01P 1/26; H01P 1/268

USPC ........................................................ 333/22 R
See application file for complete search history.

(56) References Cited

U.S. PATENT DOCUMENTS

| | | | | |
|---|---|---|---|---|
| 5,598,131 A | * | 1/1997 | Mazzochette | H03H 7/52 333/172 |
| 7,116,184 B2 | * | 10/2006 | Otsuka | G06F 13/4086 333/22 R |
| 2005/0128021 A1 | * | 6/2005 | Powell | H01P 1/268 333/22 R |

OTHER PUBLICATIONS

High Frequency 50 GHz Thin Film Chip Resistor, May 20, 2014, pp. 1-11, Document No. 53014, www.vishay.com.

* cited by examiner

*Primary Examiner* — Stephen E Jones
(74) *Attorney, Agent, or Firm* — Foley & Lardner LLP

(57) ABSTRACT

A high frequency termination device includes a printed circuit board. A ground pad having a first predetermined inductive reactance at a resonant frequency can be mounted on the printed circuit board. A resistor landing pad having a second predetermined inductive reactance at the resonant frequency can be mounted on the printed circuit board. The resistor landing pad can be selectively positioned adjacent to the ground pad to create a desired capacitive reactance at the resonant frequency to cancel at least part of the first predetermined inductive reactance and the second predetermined inductive reactance. A terminating resistor can be coupled with the resistor landing pad. An impedance of the termination device is dominated by a resistance value of the terminating resistor at the resonant frequency due to cancellation of at least part of the first predetermined inductive reactance and the second predetermined inductive reactance at the resonant frequency.

20 Claims, 10 Drawing Sheets

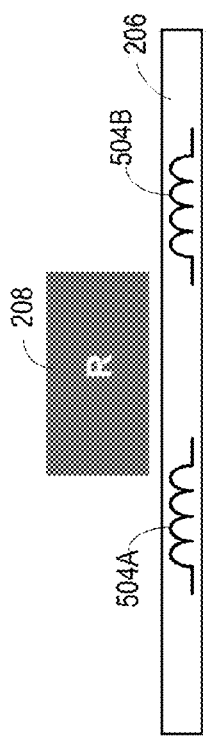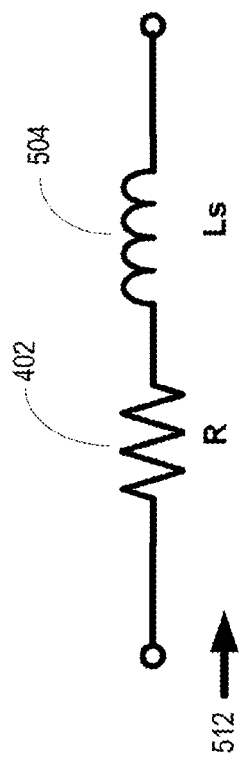
Figure 5A
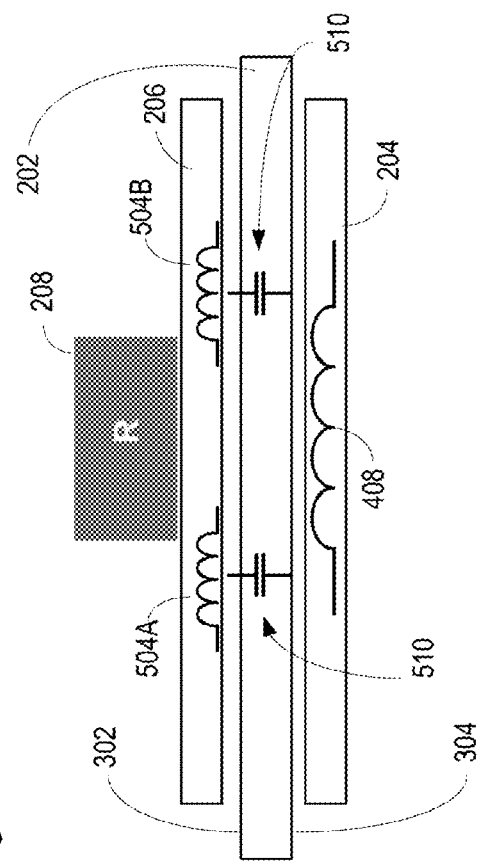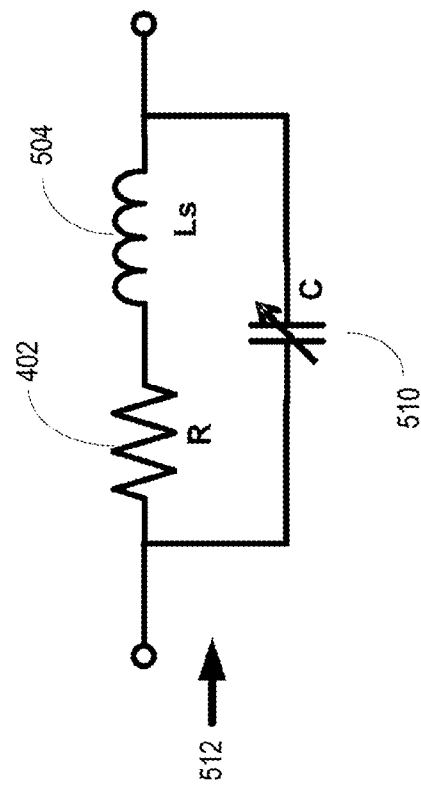
Figure 5B

HIGH FREQUENCY SIGNAL TERMINATION DEVICE

PRIORITY CLAIM

This application claims the benefit of priority to U.S. provisional patent application Ser. No. 62/274,280, filed Jan. 2, 2016 which is incorporated by reference in its entirety.

TECHNICAL FIELD

This disclosure relates to a signal termination device, and more particularly to a high frequency signal termination device.

BACKGROUND

Rapid advances in electronics and communication technologies, driven by customer demand, have resulted in the widespread adoption of electronic devices of every kind. Communication between such electronic devices is an important component. The available spectrum of wireless communication has experienced a dramatic increase in use by such communication. The speed of throughput of data over such communication links is demanded by customers. There are significant challenges related to high frequency signal communications, such as millimeter wave signaling.

BRIEF DESCRIPTION OF THE DRAWINGS

FIG. 5A is another circuit diagram of an example of a high frequency termination device.

FIG. 5B is another circuit diagram of an example of a high frequency termination device.

DETAILED DESCRIPTION

The discussion below makes reference to a wireless receiver that can be part of a system on a chip, or may be included in two or more discreet components. The wireless receiver may include a receiver architecture for receiving high frequency signals greater than 10 GHZ. To avoid a high reflection coefficient due to an impedance discontinuity, a high frequency termination device can be used for impedance matching. The impedance of the high frequency termination device is implemented with a dominant resistance component at a resonant frequency by minimizing a reactance component of the impedance at the resonant frequency. The resonant frequency can be the frequency at which wireless high frequency signals are received by the wireless receiver. The resistance component of the impedance can be created with a surface mount terminating resistor included in the termination device. The reactance component of the impedance of the termination device may be minimized by creating a capacitive reactance at the resonant frequency capable of canceling at least part of an inductive reactance present at the resonant frequency.

In an example implementation, a ground pad can be formed on a printed circuit board included in the termination device. A resistor landing pad can be positioned with respect to ground pad to create a desired capacitive reactance to compensate for a parasitic inductive reactance at the resonant frequency. Compensation can involve substantially canceling the parasitic inductive reactance with the capacitive reactance at the resonant frequency leaving the resistance component as the dominant component of the impedance of the termination device.

Figure 1:
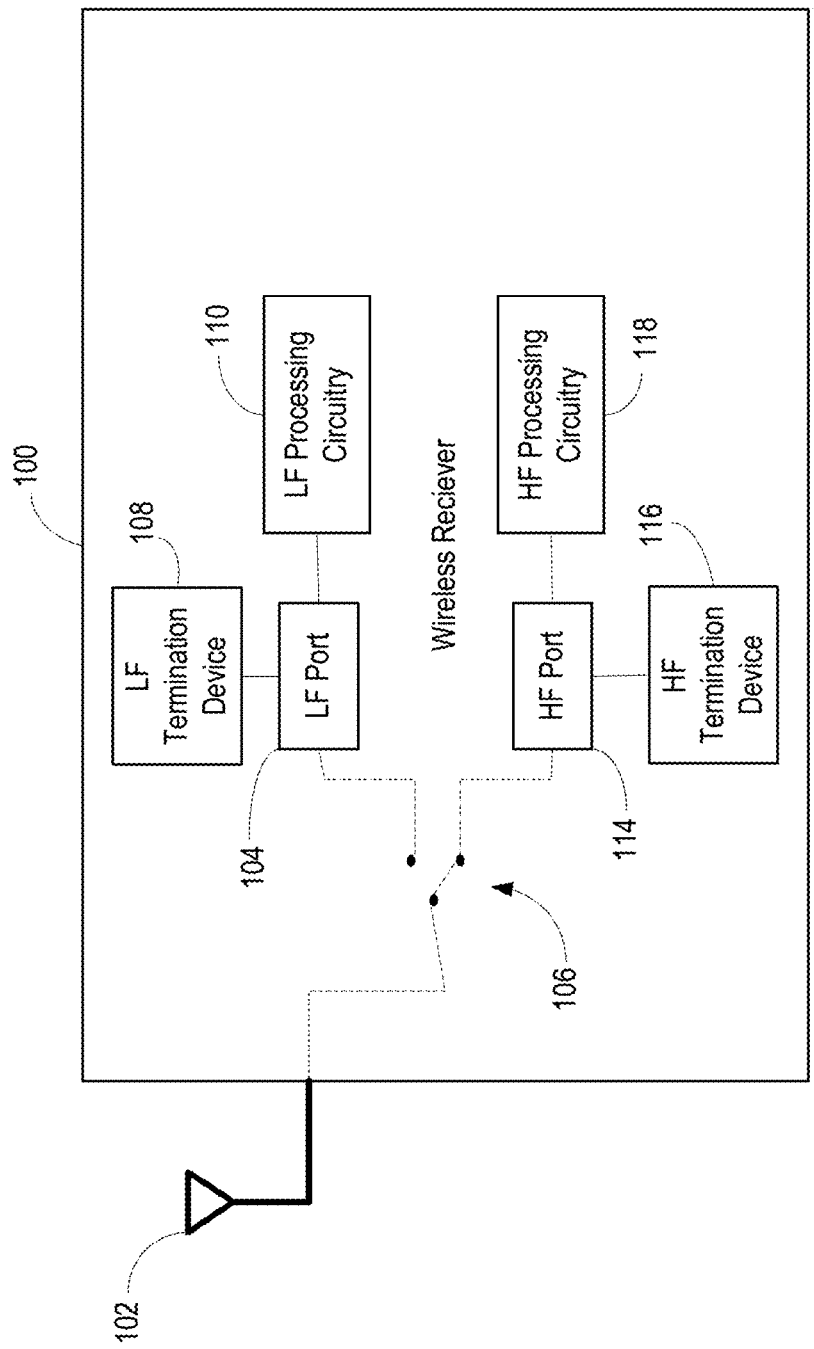
FIG. 1 is a block diagram example of a wireless receiver.

FIG. 1 is a block diagram example of a wireless receiver 100. The wireless receiver 100 can be included in any device or system capable of processing transmitted and/or received wireless signals. The wireless receiver 100 may be implemented with one or more system on a chip (SOC), discrete components, application specific integrated circuits (ASIC), discrete analog and digital circuits, and other circuitry. The wireless receiver 100 can be included in a transceiver or other system for wired and/or wireless communication. The transceiver or other system may include modulation/demodulation circuitry, digital to analog converters (DACs), shaping tables, analog to digital converters (ADCs), filters, waveform shapers, pre-amplifiers, power amplifiers and/or other circuitry for transmitting and receiving through a physical (e.g., wireline) medium such as coaxial cable, Ethernet cable, or a telephone line, and/or wirelessly through one or more antennas. Examples include mobile devices, set top boxes, laptops, or any other device or system that includes a processor and memory. The transceiver may include electrical and optical networking transceivers. Examples of electrical networking transceivers include coaxial cable network transceivers, such as a DOCSIS compliant transceiver, Ethernet, and Asynchronous Transfer Mode (ATM) transceivers. Examples of optical networking transceivers include Synchronous Optical Networking (SONET) and Synchronous Digital Hierarchy (SDH) transceivers, Passive Optical Network (PON) and Ethernet Passive Optical Network (EPON) transceivers, and EPON Protocol over Coax (EPoC) transceivers.

The receiver 100 may receive wirelessly transmitted network data through one or more networks including, for example, the Internet, or other LAN/WAN networks whether private or public, from many different sources. Examples of sources include file servers; communication satellites; computer systems; network devices such as switches, routers, and hubs; and remote databases; as well as mobile devices connected, for example, through cellular base stations. The transceiver and/or system that includes the receiver 100 can include one or more processors and memories. The memory stores, for example, control instructions that the processor can execute to carry out the described functionality for the system, such as operating the receiver 100.

The wireless receiver 100 can be coupled with an antenna 102 for receiving wireless signals at different radio frequencies. In the example of FIG. 1, the wireless receiver 100 can receive wireless signals in a first frequency range, or low frequency (LF) range, that is less than 10 GHz to support W-Fi communications such as 802.11 a/b/g/n/ac ("WiFi") communication at 1.1 GHz and/or 5 GHz. In other examples, in addition or alternatively, other forms of LF wireless communication such as Bluetooth® (BT), Wireless LAN (WLAN), Near Field Communications (NFC), and 2G, 3G, and 4G/Long Term Evolution (LTE) communications may be implemented. As used herein, the terms "Low Frequency" or "Low Frequencies" or "LF" are defined as referring to signal frequencies of 10 GHz or less. Also, although the illustrated examples of the wireless receiver 100 depict a single antenna for SISO (single input single output) communications, in other examples MISO (multiple input single output) communications and MIMO (multiple input multiple output) communications are possible. In these examples, a plurality of antennas (e.g., 2 or more) can be coupled to the wireless receiver 100 and corresponding hardware functionality as described herein can be provided.

LF signals received at the antenna 102 can be communicated to a LF port 104 via a switch 106 that is coupled to the antenna 102. The LF port 104 is coupled with an LF termination device 108 and LF processing circuitry 110. The LF termination device 108 can provide a termination impedance for the LF signals received, and the LF processing circuitry 110 can further process the LF signals. Since LF signals are being terminated, a reactance component of the termination impedance does not significantly contribute to the total termination impedance of LF termination device. As used herein, the term "coupled" may describe a directly wired interface, an indirectly wired interface, bus communication, and/or any combination that allows electrical signals to pass between coupled components, circuitry or devices.

The wireless receiver 100 can also receive wireless signals at a second frequency range, such as a high frequency (HF) greater than 10 GHz to support millimeter wave communications. Millimeterwave communications include Wi-Fi communications such as 802.11ad ("WiFi") communication at 60 GHz. As used herein, the terms "High Frequency" or "High Frequencies" or "HF" are defined as referring to signal frequencies of greater than 10 GHz, which can include frequencies in a range from 10 GHz to 100 Ghz. In an example application, HF wireless signals received by the wireless receiver 100 can be in a range of 40 GHz to 60 GHz. HF wireless signals can be communicated to a HF port 114 via the switch 106 that is coupled to the antenna 102 as illustrated. The HF port 114 is coupled with an HF termination device 116 and HF processing circuitry 118. The HF termination device 116 can provide a termination impedance for the HF signals received, and the HF processing circuitry 118 can further process the HF signals. Since HF signals are being terminated, the reactance component of the termination impedance can significantly contribute to the total termination impedance of HF termination device 116. The switch 106 can determine if the signal received at the wireless receiver 100 is a LF wireless signal or an HF wireless signal and switch to the LF port 104 or the HF port 116, respectively.

Figure 2:
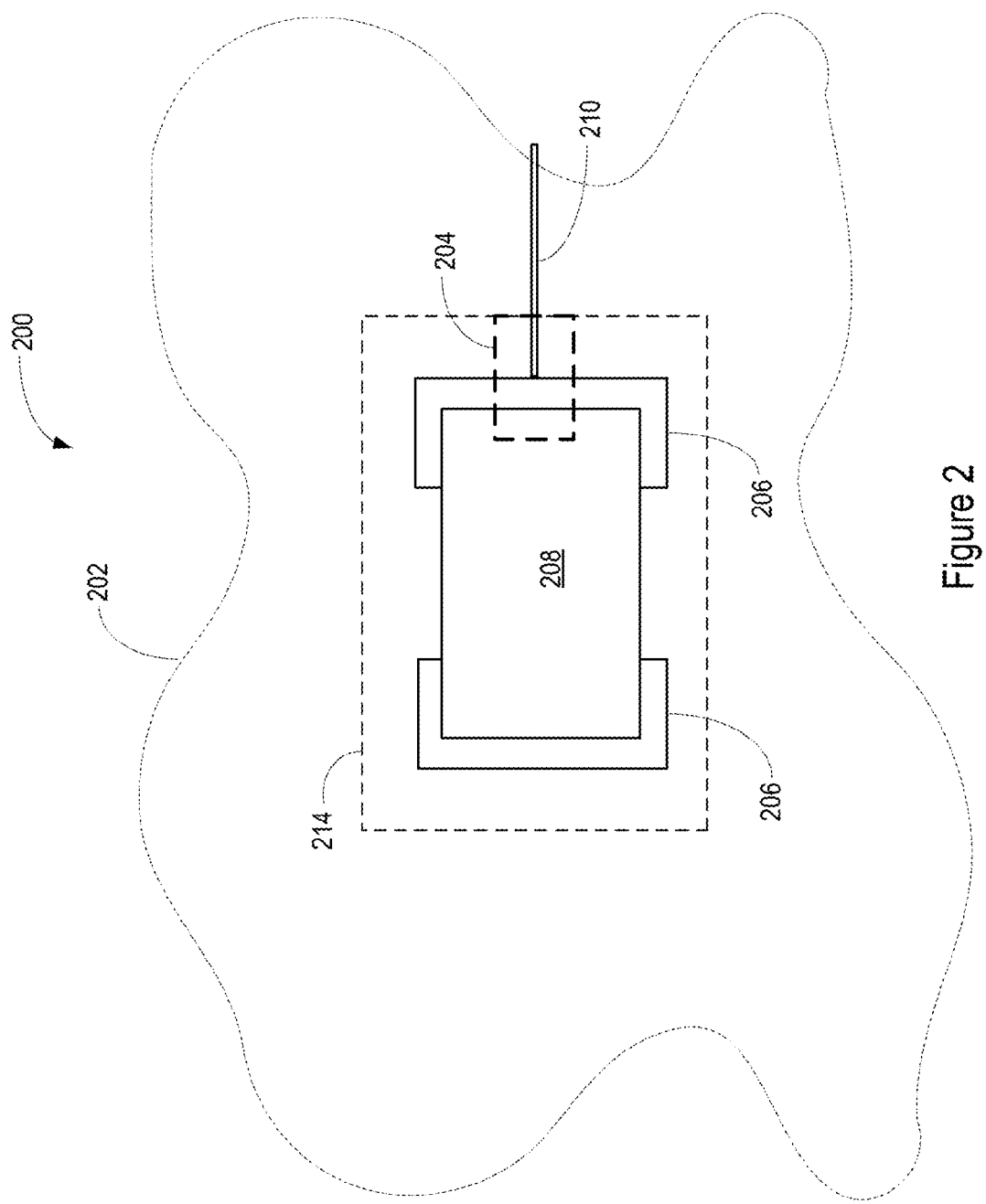
FIG. 2 is a block diagram of an example of a high frequency termination device.

FIG. 2 is a block diagram of an example of an HF termination device 200. In the example of FIG. 2, the HF termination device 200 is a passive termination device that includes a printed circuit board (PCB) 202, a ground pad 204, a resistor terminator pad 206 (or resistor landing pad 206), a terminating resistor 208 and a microstrip signal line 210.

The PCB 202 may be any form or shape that provide layers of conducting and non-conducting material. The PCB 202 can provide a mechanical support for coupling components thereto, and electrical coupling of components formed in, mounted on, and/or external to the PCB 202. The PCB 202 may include laminated layers of conducting and non-conducting material and conducting holes, or vias, that electrically connect one or more layers. In the portion of the example PCB 202 illustrated in FIG. 2, a mounting area 214 is illustrated to depict an area of the PCB 202 where the ground pad 204 is coupled to the PCB 202 below the resistor terminator pad 206 on an opposite side of the PCB 202, and terminating resistor 208 is coupled to the resistor terminator pad 206.

The terminating resistor 208 can be a surface mount resistor that operates at the resonant frequency. An example terminating resistor 208 is a Vishay High Frequency 50 GHz thin film chip resistor manufactured by Vishay Intertechnology, Inc. 63 Lancaster Avenue, Malvern, Pa. The microstrip signal line 210 can be used to provide a HF signal to the terminating resistor 206 via the resistor terminator pad 206, however, in other examples the HF signal may be provided to the terminating resistor 208 by other signal communication paths and the microstrip signal line 210 may be omitted. In FIG. 2, there are two resistor terminator pads 206 illustrated, however, in other examples, fewer or additional numbers of resistor terminator pads are possible. In general, the number, size and configuration of the resistor terminator pad 206 is predetermined by the manufacturer of the terminating resistor 208.

As illustrated in FIG. 2, the ground pad 204 is positioned within the mounting area 214 included on the PCB 202 such that the resistor landing pad 206 overlaps at least a part of the ground pad 204. An area and location of the ground pad 204, and a distance between the ground pad 204 and the resistor landing pad 206 are predetermined to create a capacitive reactance to compensate for a parasitic inductive reactance of at least the resistor landing pad 206.

Figure 3:
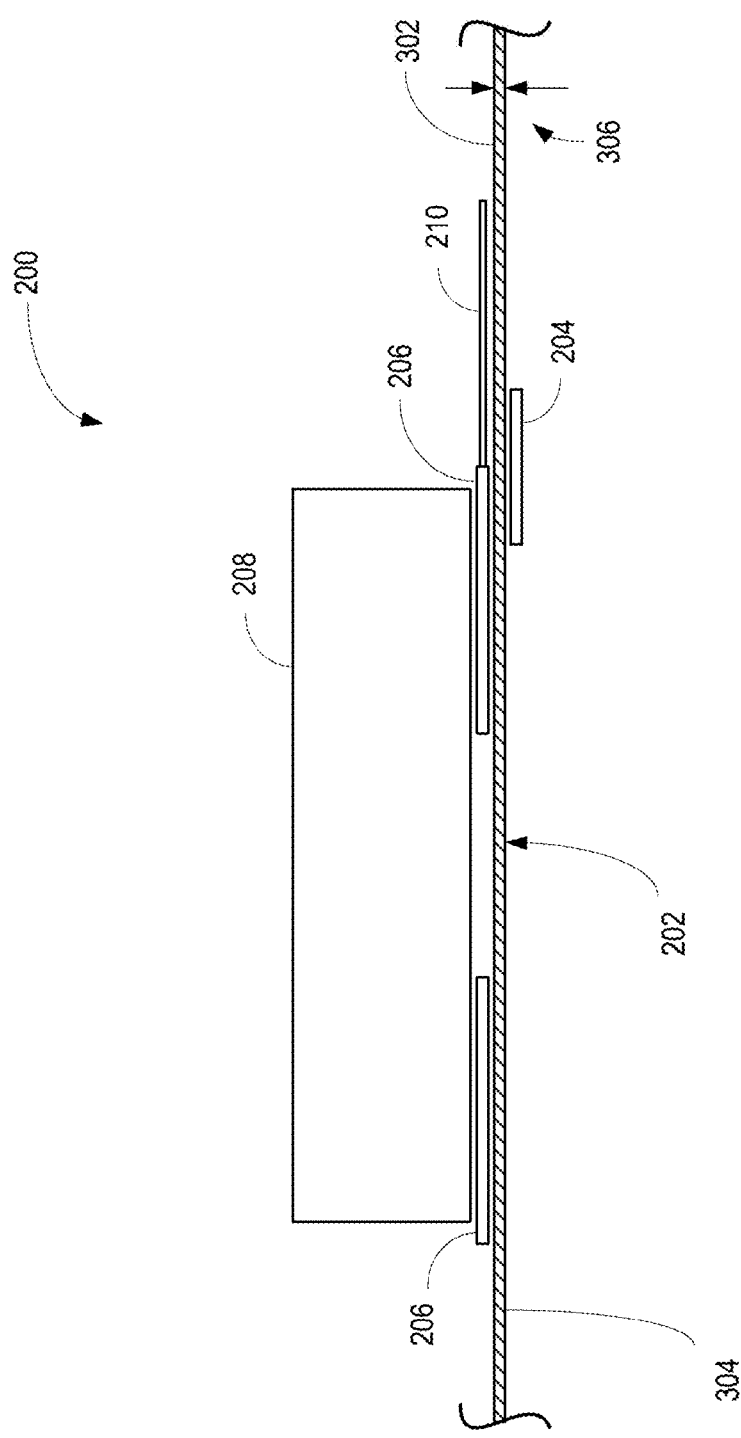
FIG. 3 is a side elevation view of an example high frequency termination device.

FIG. 3 is a side elevation view of an example HF termination device 200. In FIG. 3, the resistor terminator pad 206 and terminating resistor 208 are coupled to a first surface 302 of the PCB 202 at a first layer and the ground pad 204 is coupled to an opposing second surface 304 of the PCB 202 at a second layer. Thus, a distance 306 between the resistor terminator pad 206 and the ground pad 204 can be defined by the thickness of the PCB 202. The portion of the PCB 202 lying between the resistor terminator pad 206 and the ground pad 204 can be a dielectric providing an insulating layer therebetween. In other examples, the PCB 202 may include multiple layers spaced apart by dielectric layers of the PCB 202, such that the ground pad 204 can be positioned on a first layer and the resistor terminator pad 206 can be positioned on a second layer spaced apart by a dielectric layer of the PCB 202. In still other examples, the ground pad 204 can be positioned in the mounting area of the PCB 202, and the resistor terminator pad 206 can be spaced away from the ground pad 204 by being mounted adjacent the PCB 202 with a dielectric layer therebetween.

The ground pad 204 can have a first predetermined inductive reactance at a resonant frequency and be mounted at a first layer of the PCB 202, while the resistor landing pad 206 can have a second predetermined inductive reactance at the resonant frequency and be mounted at a second layer of the PCB 202. By selectively positioning the resistor landing pad 206 adjacent to the ground pad 202 a desired predetermined capacitive reactance at the resonant frequency can be created to cancel at least part of the first predetermined inductive reactance and the second predetermined inductive reactance. The positioning of the ground pad 204 with respect to the resistor landing pad 206 can be considered as similar to forming a parallel plate capacitor. Thus, the desired predetermined capacitive reactance can be created based on a capacitor formed by an area of the ground pad 204 being sized to form a bottom conductor, an area of the resistor landing pad 206 being sized to form a top conductor, and a thickness and dielectric content of the printed circuit board 202 being selected as an insulator between the top conductor and the bottom conductor. A total area of the ground pad 204 and the resistor landing pad 206 can be adjustable based on a predetermined size of the resistor landing pad 206 and/or the ground pad 204, and the ground pad 204 can be positioned at a predetermined distance with respect to the resistor landing pad 206 to create the desired predetermined capacitive reactance.

The resonant frequency can be the frequency of the HF signal received by the terminating resistor 208, which is terminated on the resistor landing pad 206 by being coupled thereto. An impedance of the HF termination device 200 can be dominated by a resistance value of the terminating resistor 208 due to cancellation of at least part of the first predetermined inductive reactance and the second predetermined inductive reactance at the resonant frequency.

Figure 4:
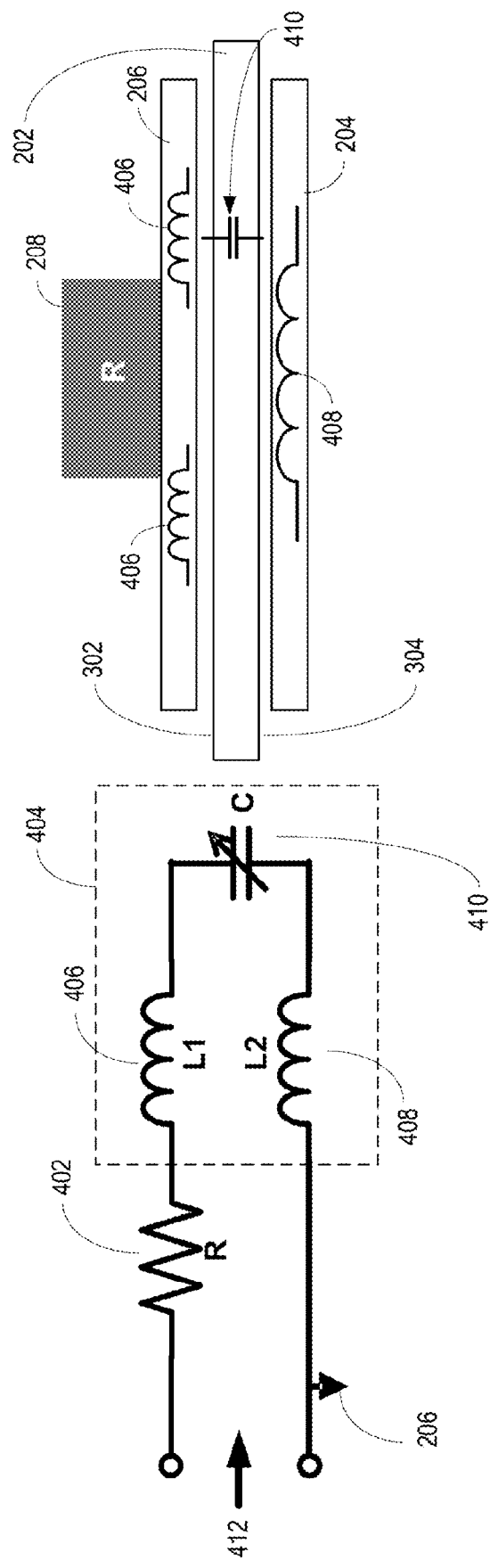
FIG. 4 is a circuit diagram of an example of a high frequency termination device.

FIG. 4 is a circuit diagram of an example of a HF termination device 200. In FIG. 4, the circuit equivalency of the resistor 208 is a resistance R 402, and the circuit equivalency of the parasitic reactance can be represented with an LC tank circuit 404. The LC tank circuit 404 can include a first parasitic inductive reactance L1 406 representative of the parasitic shunt inductive reactance of the resistor terminator pad 206, and a second parasitic inductive reactance 408 representative of the parasitic shunt inductive reactance of the ground pad 204. Thus, an impedance (Z) 412 of the HF termination device 200 encountered by the received HF signal can be the combination of resistance (R) 402 and the first and second parasitic inductive reactance L1 and L2 (406 and 408) ($L_g$) can be represented by:

$$Z=R+j\omega L_g \qquad \text{Equation 1}$$

where ω is the angular resonant frequency, j is the square root of minus one and $L_g$ is the combination of the first and second parasitic inductive reactance L1 and L2 (406 and 408).

The LC tank circuit 404 also includes a capacitive reactance C 410. The capacitive reactance C 410 is predetermined capacitance provided between the ground pad 204 and the resistor terminator pad 206 at the resonant frequency. Thus, the impedance (Z) 412 of the HF termination device 200 as encountered by the received HF signal can be the combination of resistance R 402 and the parasitic reactance 404 consisting of both the parasitic inductive reactance $L_g$ (406 and 408) and the capacitive reactance C 410 as represented by:

$$Z = R + j\omega L_g + \frac{1}{j\omega C} \qquad \text{Equation 2}$$

Since the parasitic inductive reactance L (406 and 408) and the capacitive reactance C (410) are in series in the LC tank circuit 404 their contributions to the total circuit impedance are opposite such that the capacitive reactance C 410 can compensate for the parasitic inductive reactance $L_g$ (406 and 408) by canceling at least part of the parasitic shunt inductive reactance (406 and 408). Thus, where:

$$C = \frac{1}{\omega^2 L_g} \text{ then } Z = R \qquad \text{Equation 3}$$

In addition, the HF termination device 200 can include parasitic series inductive reactance contributed by the resistor terminator pads 206. Thus, the capacitive reactance C can be predetermined to also compensate for both the parasitic shunt inductive reactance $L_g$ and a parasitic series inductive reactance $L_s$.

FIGS. 5A and 5B are another circuit diagram of an example of an HF termination device 200. In FIG. 5A, the circuit equivalency of the resistor 208 remains the resistance R 402, and the circuit equivalency of a parasitic reactance ($L_s$) 504 can be represented with a first parasitic inductive reactance L1 504A representative of the parasitic series inductive reactance of one of the resistor terminator pads 206, and a second parasitic series inductive reactance 504B representative of the parasitic series inductive reactance of the other of the resistor terminator pads 206. Thus, an impedance (Z) 512 of the HF termination device 200 as encountered by the received HF signal can include the combination of resistance (R) 402 and the first and second parasitic series inductive reactances 504A and 504B ($L_s$), which can be represented by:

$$Z=R+j\omega L_s \qquad \text{Equation 4}$$

where ω is the angular resonant frequency and j is the square root of minus one.

In this example, as illustrated in FIG. 5B, the impedance (Z) 512 of the HF termination device 200 as encountered by the received HF signal can be the combination of resistance R 402 and the parasitic reactance 504 consisting of both the parasitic series inductive reactance $L_s$ (504A and 504B) and an additional capacitive reactance C 510 as represented by:

$$Z=R+j\omega L_s+1/j\omega C \qquad \text{Equation 5}$$

Since the parasitic series inductive reactance $L_s$ (504A and 504B) and the capacitive reactance C 510 are in series their contributions to the total circuit impedance are opposite such that the capacitive reactance C 510 can compensate for the parasitic series inductive reactance $L_s$ (504A and 504B) by canceling at least part of the parasitic series inductive reactance $L_s$ (504A and 504B). Thus, where:

$$C = \frac{1}{\omega^2 L_s} \text{ then } Z = R \qquad \text{Equation 6}$$

Referring to FIGS. 4 and 5 the impedance (Z) 412 and 512 of the HF termination device 200 as encountered by the received HF signal can be dominated by the resistance of the resistance R 402 when both the parasitic reactance consisting of the parasitic inductive reactance $L_g$ (406 and 408) and the parasitic series inductive reactance $L_s$ (504A and 504B) are compensated by the capacitive reactance C 510 as represented by:

$$Z = R + j\omega L_g + j\omega L_s + 1/j\omega C \qquad \text{Equation 7}$$

$$\text{Thus, where } C = \frac{1}{\omega^2 L_g} + \frac{1}{\omega^2 L_s} \text{ then } Z = R \qquad \text{Equation 8}$$

In FIGS. 4 and 5, the capacitive reactance C 410 and 510 is illustrated as variable. The capacitive reactance C can be varied by any of at least four parameters to compensate for the parasitic shunt inductive reactance $L_g$ and/or the parasitic series inductive reactance $L_s$. Examples of the four parameters are:

1) Dielectric content of the PCB;
2) Thickness of the PCB;
3) Area of the surface of the ground pad 204 and/or the resistor landing pad 206; and
4) Position of the resistor landing pad 206 with respect to the ground pad 204.

Changes in the dielectric content of the PCB 202 are proportional to changes in capacitive reactance. For example, as the dielectric content increases, the capacitive reactance correspondingly increases. Since in the examples of FIGS. 4 and 5B the resistor terminator pad 206 is coupled with the first side 302 of the PCB 202 and the ground pad 204 is coupled with the second side 304 of the PCB 202, as the thickness of the PCB 202 increases, the capacitive reactance correspondingly decreases since the distance between the ground pad 204 and the resistor landing pad 206 increases. In addition, increases in the surface area of the ground pad 204 correspondingly increase the capacitive reactance.

The capacitive reactance C can be created and changed to compensate for the parasitic shunt inductive reactance of the resistor landing pad 206, the parasitic series inductive reactance of the resistor landing pad 206, and/or the parasitic inductive reactance of the ground pad 204. Selection of a predetermined amount of the capacitive reactance C can be based on impedance matching of the HF termination device to the line impedance in order to achieve a desired reflection coefficient at the resonant frequency by reducing impedance discontinuity. In one example, the level of a desired reflection coefficient is $\frac{1}{100}$ resulting in a return node of the HF termination device providing −20 dB. In another example, a desired level of the reflection coefficient is $\frac{1}{10}$ resulting in a return node of the HF termination device providing −10 dB. A predetermined amount of capacitive reactance created using the ground pad 204 and the resistor landing pad 206 can substantially cancel the parasitic inductive reactance resulting in the resistance of the terminating resistor being dominant at the resonant frequency.

Substantially canceling the parasitic inductive reactance at the resonant frequency is defined as reducing the reactance sufficiently to achieve the desired reflection coefficient. Thus, substantially canceling the parasitic inductive reactance is defined as when the reflection coefficient is equal to or less than $\frac{1}{100}$, or when the reflection coefficient is equal to or less than $\frac{1}{10}$, depending on the application. Accordingly, the capacitive reactance can be created to substantially cancel the parasitic inductive reactance of the resistor landing pad and the ground pad such that the termination device provides a combined impedance of the ground pad, the resistor landing pad and the resistor that is dominated by resistance. The combined impedance can be dominated by a resistance of the terminating resistor at the resonant frequency since the reactance of the termination device has been reduced to achieve the desire reflection coefficient.

Figure 6:
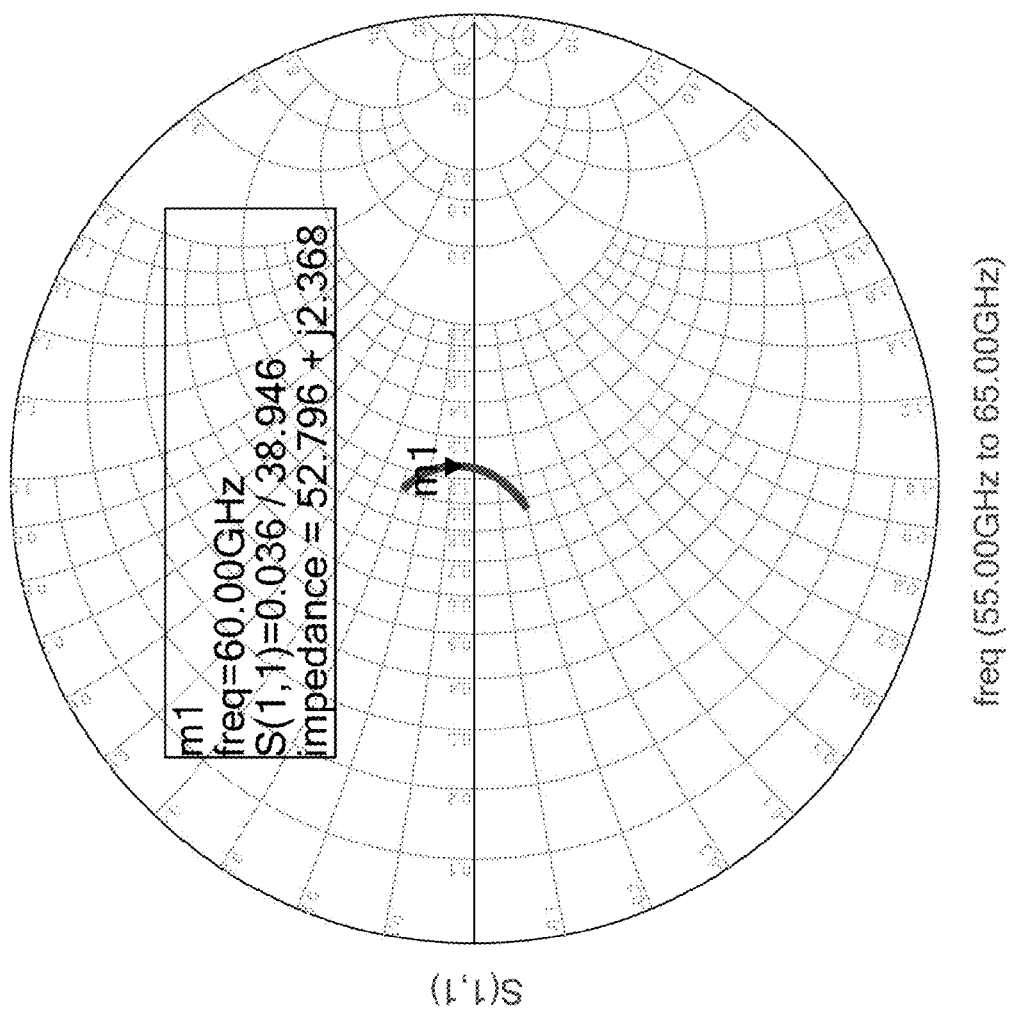
FIG. 6 is polar plot of an example of the high frequency termination device of FIG. 2.

FIG. 6 is polar plot of an example of the HF termination device 200 of FIG. 2. In this example, the HF termination device 200 is providing a termination resistance of about fifty ohms at the resonant frequency. In other examples, other termination resistances, such as an resistance in a range of twenty to one hundred ohms are possible. The resistance of the terminating resistor 208 forms the dominant part of the fifty ohm termination resistance due to the parasitic inductive reactance being substantially canceled by a predetermined capacitive reactance produced by cooperative operation of the ground pad 204 and the resistance landing pad 206 at the resonant frequency to minimize reactance.

In the example of FIG. 6, the resonant frequency is 60 GHz, the reflection coefficient S(1,1) has an amplitude of 0.036, which is close to zero resulting in substantially no reflection, and a phase of 38.946. Since the reflection is within the desired range, the phase is acceptable. The impedance is 52.796 ohms and a reactance of j2.368 due to the substantial cancellation of parasitic inductive reactance by the capacitive reactance.

Figure 7:
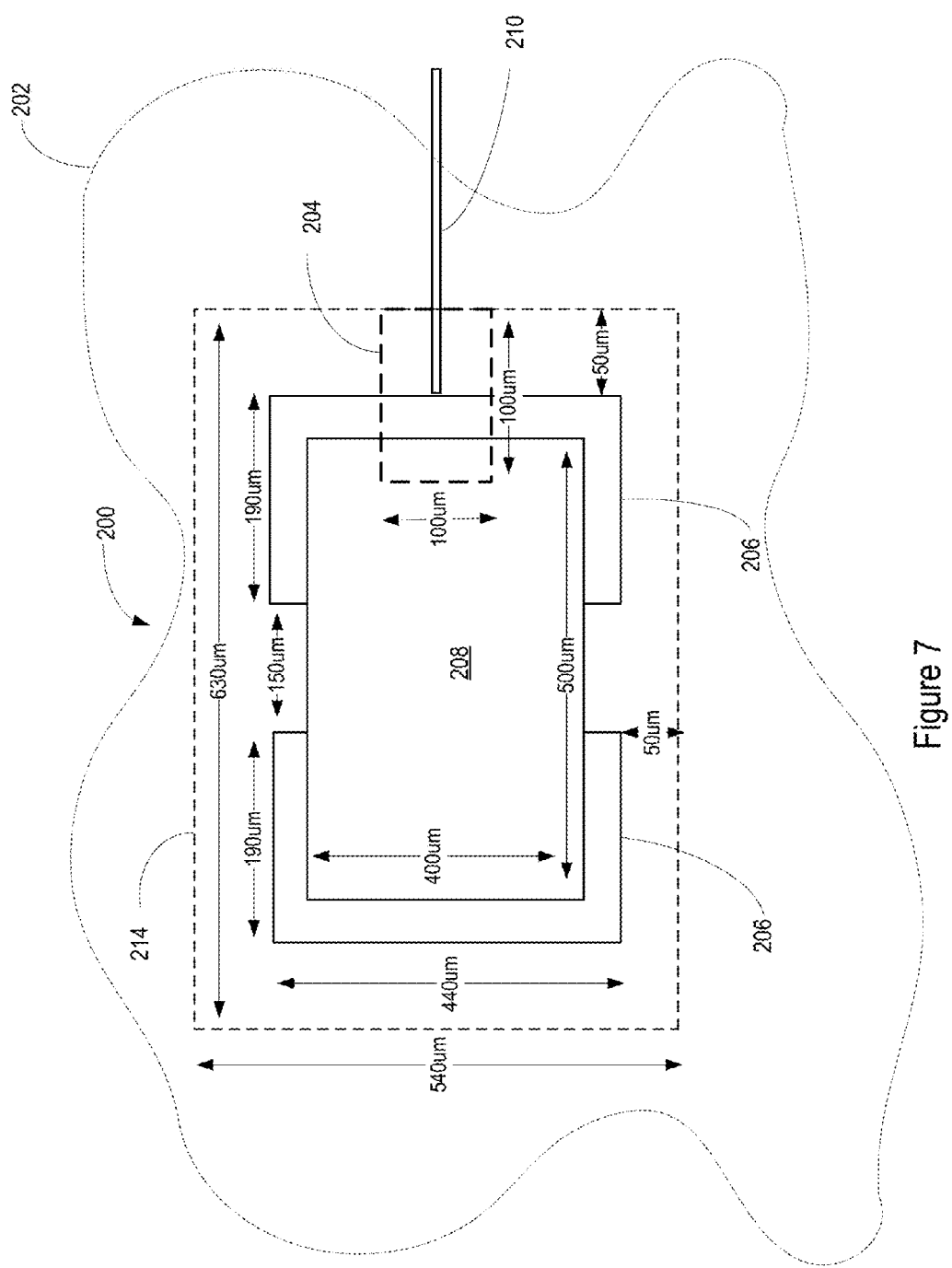
FIG. 7 is a block diagram illustrating dimensions of an example of the high frequency termination device of FIG. 2.

FIG. 7 is a block diagram illustrating dimensions of an example of the HF termination device of FIG. 2. The ground pad 204 of FIG. 7 has been sized to provide a predetermined area with respect to a predetermined area of the resistor terminator pad 206 to provide a predetermined capacitive reactance at the resonant frequency. In addition, the ground pad 204 has been positioned with respect to the resistor terminator pad 206 to provide the predetermined capacitive reactance at the resonant frequency. The mounting area 214 has also been sized to space the termination device 200 away from other components a predetermined distance on the PCB 202 to minimize parasitic shunt inductance with other components at the resonant frequency due to the resonant frequency being greater than 10 GHz. The size of the resistor terminator pads 206 are based on the requirements of the terminating resistor 208. Thus, changes in the mounting or terminating requirements of the terminating resistor 208 may result in a change in the area of the resistor terminator pads 206, which may result in a change in the area and/or placement of the ground pad 204 in order to substantially cancel the parasitic inductive reactance with the predetermined capacitive reactance at the resonant frequency.

Figure 8:
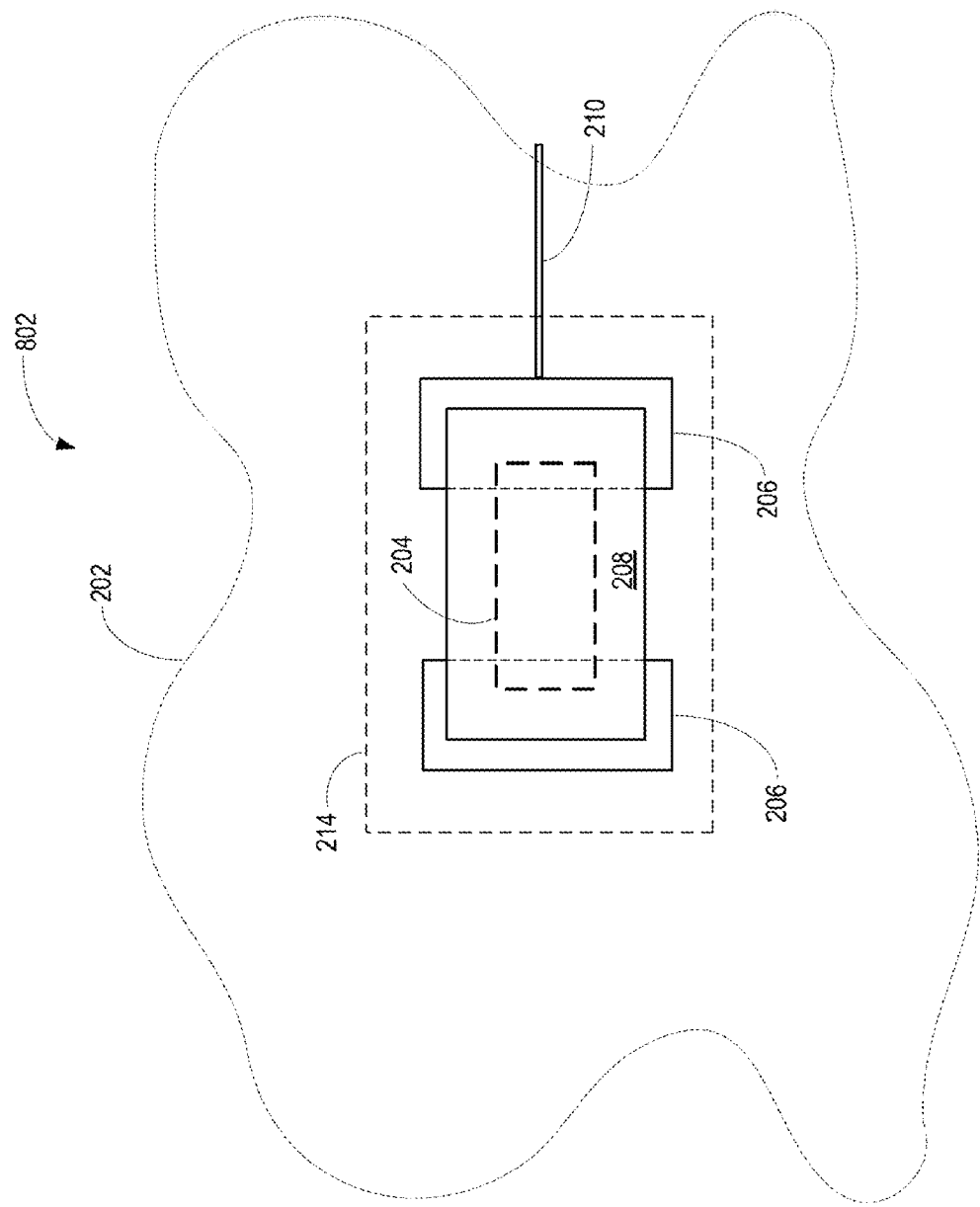
FIG. 8 is a block diagram of another example of a high frequency termination device.

FIG. 8 is a block diagram of another example of an HF termination device 802. In the example of FIG. 8, the termination device 802 is configured to provide a termination resistance of twenty-five ohms at a resonant frequency greater than 10 GHz. The termination device 802 includes a ground pad 204 sized with a predetermined area and positioned with respect to the resistor terminator pad 206 so as to generate a predetermined capacitive reactance sufficient to substantially cancel a parasitic inductive reactance of the termination device 802. In this example, the ground pad 204 is positioned in the mounting area 214 on an opposing side of the PCB 202 from the resistor terminator pad 206 and the terminating resistor 208 such that the ground pad 204 is under or above the terminating resistor 208. In this configuration, a substrate dielectric of the PCB 202 provides a distance between the ground pad 204 and the resistor terminator pad 206. In other examples, other sizes and positioning of the ground pad 204 and the resistor terminator pad 206 are possible to obtain the predetermined capacitive reactance that substantially cancels the parasitic inductive reactance and thereby minimizes the reactance to allow a desired reflection coefficient to be achieved when a HF wireless signal at the resonant frequency is provided to the termination device.

Figure 9:
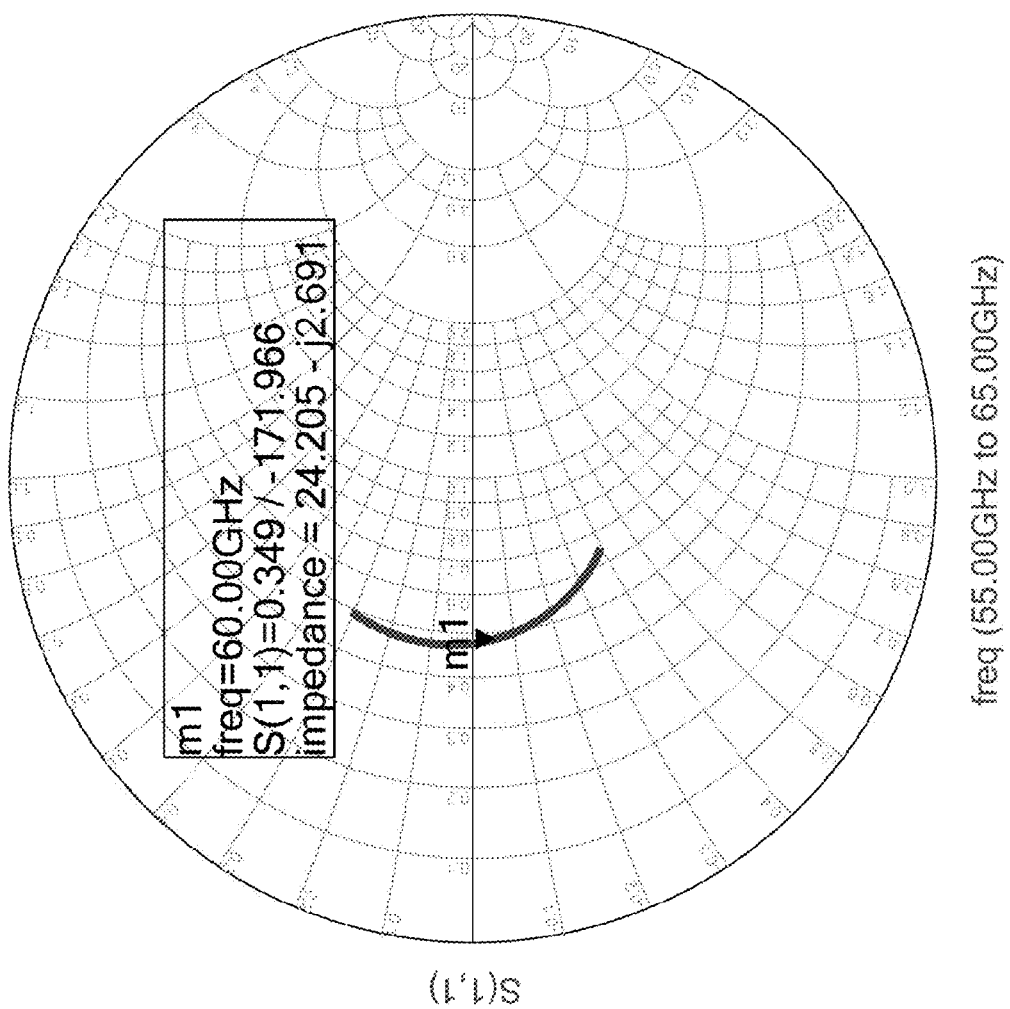
FIG. 9 is a polar plot of an example of the high frequency termination device of FIG. 8.

FIG. 9 is a polar plot of an example of the HF termination device 802 of FIG. 8. In this example, the HF termination device 802 is providing a termination resistance of about twenty five ohms at the resonant frequency. The resistance of the terminating resistor forms the dominant part of the twenty-five ohm termination resistance due to the parasitic inductive reactance being substantially canceled by a predetermined capacitive reactance produced by cooperative operation of the ground pad 204 and the resistance landing pad 206 at the resonant frequency.

In the example of FIG. 9, the resonant frequency is 60 GHz, the reflection coefficient S(1,1) has an amplitude of 0.349, which is close to zero resulting in substantially no reflection, and a phase of −171.966. The impedance is 24.205 ohms and a reactance of −j2.691 due to the substantial cancellation of parasitic inductive reactance by the capacitive reactance.

Figure 10:
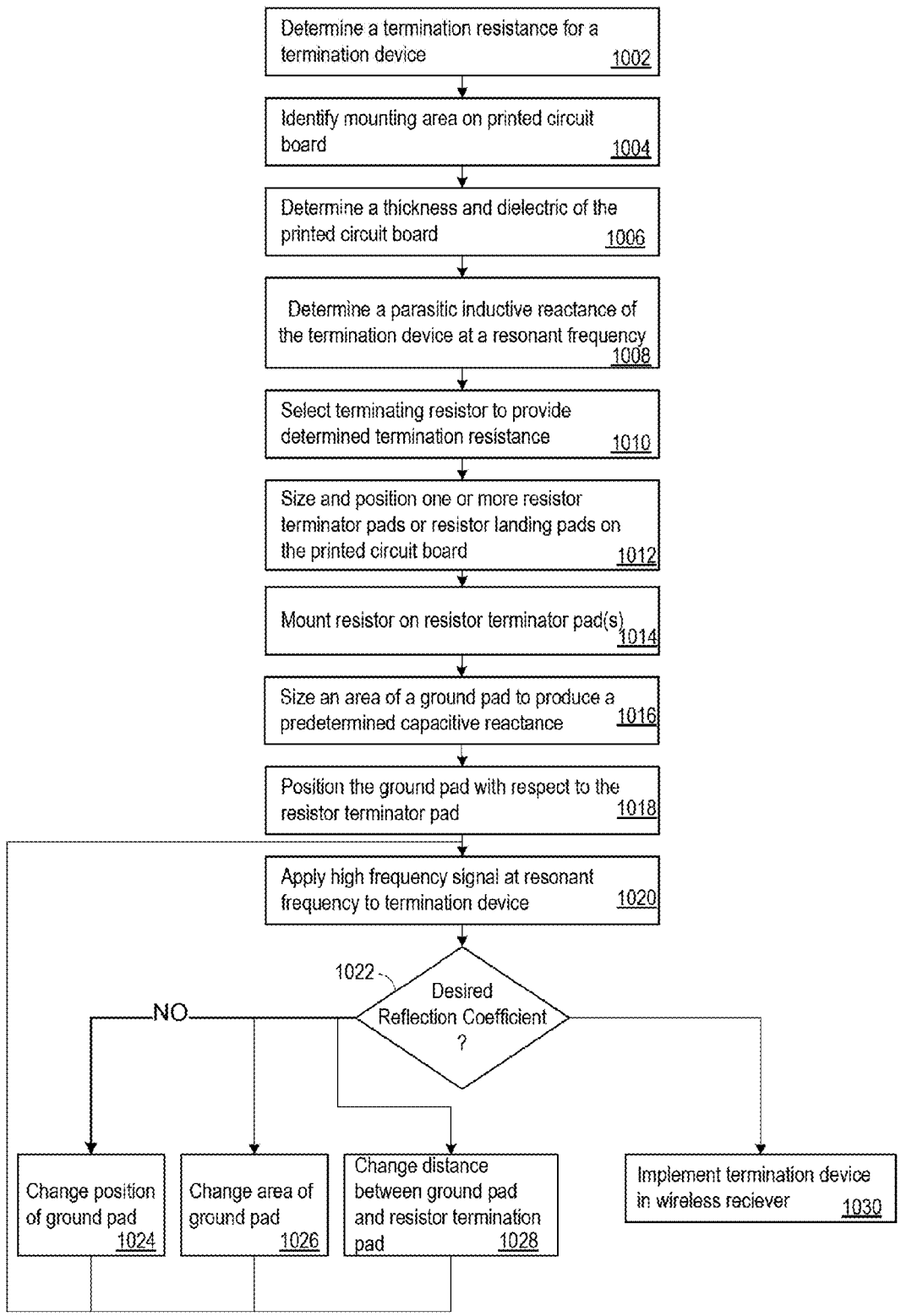
FIG. 10 is an operational flow diagram illustrating an example of a method to minimize the reactance of a termination device at a high frequency resonant frequency.

FIG. 10 is an operational flow diagram illustrating an example of a method to minimize the reactance of a termination device at a high frequency resonant frequency. The method determines a target termination resistance (1002), such as twenty five ohms, based impedance matching of a characteristic impedance of an antenna receiving an HF wireless signal. A mounting area on a PCB of the termination device is identified (1004). In this example, the mounting area is on opposing surfaces of the PCB such that the ground pad is mounted on a first surface of the PCB and the resistor terminator pad and terminating resistor are mounted on an opposing second surface of the PCB. Thus, in this example a thickness and a dielectric of the PCB is determined (1006) since the thickness of the PCB dielectric will be the capacitor dielectric between the ground pad and the resistor terminator pad. A parasitic inductive reactance of the termination device at a resonant frequency is determined. (1008) The resonant frequency can be the same as the frequency of the HF wireless signal being terminated by the termination device. The parasitic inductive reactance can include inductive reactance associated with the signal side and the ground side. Thus, a parasitic shunt inductive reactance and a parasitic series inductive reactance can be identified as the parasitic inductive reactance.

A terminating resistor may be selected to achieve the target termination resistance (1010) at the resonant frequency. A resistor terminator pad can be sized and positioned on the PCB in the mounting area based on the selected terminating resistor. (1012) The terminating resistor can be mount on the resistor terminator pad, and the resistor and the resistor terminator pad can form a predetermined impedance for termination of a high frequency wireless signal operable at the resonant frequency. (1014) A size of an area of a ground pad can be determined to produce a predetermined capacitive reactance. (1016) The ground pad can be positioned with respect to the resistor terminator pad to obtain the predetermined capacitive reactance by mounting the ground pad on the printed circuit board in the mounting area in a predetermined position with respect to the resistor terminator pad so that the ground pad is space away from the resistor terminator pad by a predetermined distance. (1018) The predetermined position of the ground pad with respect to the resistor terminator pad can create a predetermined capacitive reactance between the resistor terminator pad and the ground pad at a resonant frequency to compensate for the parasitic inductive reactance associated with at least one of the resistor terminator pad and/or the ground pad at the resonant frequency.

A high frequency signal can be applied at the resonant frequency to the termination device. (1020) It is determined if the desired reflection coefficient is at or below a desired level. (1022). If the desired reflection coefficient is not at or below the desired level, the capacitive reactance did not substantially cancel the parasitic inductive reactance and either the position of the ground pad with respect to the resistor terminator pad can be adjusted (1024), the size of the ground pad can be adjusted to change the area of the ground pad (1026), or the distance between the ground pad and the resistor terminator pad can be adjusted (1028). Although not indicated, the dielectric content of the PCB could also be adjusted, such as by using a different PCB. The high frequency signal at the resonant frequency can then be re-applied. (1018) When the reflection coefficient is at the desired level (1022), the termination device can be implemented in the wireless receiver. (1030)

The methods, devices, processing, circuitry, and logic described above may be implemented in many different ways and in many different combinations of hardware and software. Various implementations have been specifically described. However, many other implementations are also possible.

I claim:

1. A high frequency termination device comprising:
   a printed circuit board;
   a ground pad having a first predetermined inductive reactance at a resonant frequency and being mounted on the printed circuit board;
   a resistor landing pad having a second predetermined inductive reactance at the resonant frequency and being mounted on the printed circuit board, the resistor landing pad selectively positioned adjacent to the ground pad to create a desired capacitive reactance at the resonant frequency to cancel at least part of the first predetermined inductive reactance and the second predetermined inductive reactance; and
   a terminating resistor coupled with the resistor landing pad, an impedance of the termination device dominated by a resistance value of the terminating resistor at the resonant frequency due to cancellation of at least part of the first predetermined inductive reactance and the second predetermined inductive reactance at the resonant frequency.

2. The high frequency termination device of claim 1, wherein the resistor landing pad is positioned at a first layer of the printed circuit board and the ground pad is positioned at a second layer of the printed circuit board to be a predetermined distance from the ground pad, and the ground pad is dimensioned to form a predetermined area so as to create the desired capacitive reactance at the resonant frequency.

3. The high frequency termination device of claim 1, wherein the desired capacitive reactance is created based on a capacitor formed by an area of the ground pad being sized to form a bottom conductor, an area of the resistor landing pad being sized to form a top conductor, and a thickness and dielectric content of the printed circuit board being selected as an insulator between the top conductor and the bottom conductor.

4. The high frequency termination device of claim 1, wherein the ground pad and the resistor landing pad cooperatively operate to create the desired capacitive reactance as a function of an area of the ground pad and the resistor landing pad, a thickness and dielectric content of the printed circuit board, and the selective position of the resistor landing pad with respect to the ground pad.

5. The high frequency termination device of claim 1, wherein a total area of the ground pad and the resistor landing pad are adjustable based on a predetermined size of the ground pad, and the resistor landing pad is positioned at a predetermined distance with respect to the ground pad to create the desired capacitive reactance.

6. The high frequency termination device of claim 1, wherein the resonant frequency is a predetermined value between 10 GHz and 100 GHz.

7. The high frequency termination device of claim 1, wherein the resonant frequency is between 55 GHz and 65 GHz.

8. The high frequency termination device of claim 1, wherein the terminating resistor is a surface mount resistor.

9. The high frequency termination device of claim 1, wherein the termination device is a passive termination device for termination of wireless signals with a frequency greater than 10 GHz.

10. A high frequency termination device comprising:
a printed circuit board comprising a mounting area;
a ground pad positioned within the mounting area;
a resistor landing pad positioned to overlap at least a part of the ground pad, wherein an area and location of the ground pad, and a distance between the ground pad and the resistor landing pad are predetermined to produce, at a resonant frequency, a predetermined capacitive reactance to compensate for a parasitic inductive reactance of at least the resistor landing pad; and
a resistor coupled with the resistor landing pad.

11. The high frequency termination device of claim 10, wherein the printed circuit board includes a first surface opposing a second surface, the ground pad mounted within the mounting area on the first surface, and the resistor landing pad mounted on the second surface such that the distance between the ground pad and the landing pad is based on a thickness of the printed circuit board.

12. The high frequency termination device of claim 10, wherein the capacitive reactance is predetermined to also compensate for a parasitic inductive reactance of the ground pad.

13. The high frequency termination device of claim 12, wherein the capacitive reactance is created to substantially cancel the parasitic inductive reactance of the resistor landing pad and the ground pad.

14. The high frequency termination device of claim 10, wherein the resistor is a connectable to a signal line for termination of a high frequency wireless signal operable at the resonant frequency.

15. The high frequency termination device of claim 10, wherein the termination device comprises a combined impedance of the ground pad, the resistor landing pad and the resistor, the combined impedance being dominated by a resistance of the resistor at the resonant frequency.

16. A method comprising:
mounting a resistor terminator pad on a printed circuit board;
mounting a ground pad in a predetermined position with respect to the resistor terminator pad so that the resistor terminator pad is spaced away from the ground pad by a predetermined distance;
the predetermined position of the ground pad with respect to the resistor terminator pad creating a predetermined capacitive reactance between the resistor terminator pad and the ground pad at a resonant frequency to compensate for a parasitic inductive reactance associated with at least one of the resistor terminator pad or the ground pad at the resonant frequency; and
mounting a resistor on the resistor terminator pad, the resistor and the resistor terminator pad forming a predetermined impedance for termination of a high frequency wireless signal operable at the resonant frequency.

17. The method of claim 16, wherein the resonant frequency is greater than 10 GHz.

18. The method of claim 16, wherein the ground pad has a first predetermined inductive reactance, and the resistor terminator pad has a second predetermined inductive reactance, and the method comprises the predetermined capacitive reactance canceling at least part of the first and the second predetermined inductive reactance at the resonant frequency, the resonant frequency being greater than 10 GHZ.

19. The method of claim 16, wherein terminating the resistor comprises surface mounting the resistor on the resistor terminator pad.

20. The method of claim 16, further comprising sizing the ground pad to have a predetermined area to obtain the predetermined capacitive reactance at the resonant frequency.

* * * * *